(12) United States Patent
Kanno et al.

(10) Patent No.: US 7,081,871 B2
(45) Date of Patent: Jul. 25, 2006

(54) LIGHT-EMITTING DEVICE HAVING A PLURALITY OF EMISSION LAYERS

(75) Inventors: Hiroshi Kanno, Osaka (JP); Yuji Hamada, Ikoma-gun (JP); Kazuki Nishimura, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 525 days.

(21) Appl. No.: 10/670,200

(22) Filed: Sep. 26, 2003

(65) Prior Publication Data

US 2004/0066138 A1 Apr. 8, 2004

(30) Foreign Application Priority Data

Sep. 30, 2002 (JP) .............................. 2002-287418

(51) Int. Cl.
G09G 3/30 (2006.01)
(52) U.S. Cl. .............................. 345/76; 345/36; 345/84
(58) Field of Classification Search .................. 345/36, 345/45, 46, 48, 72, 76, 77, 83, 84
See application file for complete search history.

(56) References Cited

U.S. PATENT DOCUMENTS 4,995,043 A * 2/1991 Kuwata et al. ................ 372/7
6,541,130 B1 * 4/2003 Fukuda ........................ 428/690
6,831,406 B1 * 12/2004 Fukuyama et al. .......... 313/504

FOREIGN PATENT DOCUMENTS

| JP | 3065704 | 5/2000 |
|---|---|---|
| JP | 2000-243563 A | 9/2000 |
| JP | 2000-323277 A | 11/2000 |
| JP | 3287344 | 3/2002 |
| JP | 2002-134273 A | 5/2002 |
| JP | 2003-272860 A | 9/2003 |

* cited by examiner

Primary Examiner—Richard Hjerpe
Assistant Examiner—Jean Lesperance
(74) Attorney, Agent, or Firm—McDermott Will & Emery LLP

(57) ABSTRACT

A light-emitting device including a plurality of emission layers, which has improved luminous efficiency and improved emission lifetime, is provided. In the light-emitting device, a first optical film thickness range $L_1$ from a light-emitting position of a first emission layer to a light-emitting surface of the device, a second optical film thickness range $L_2$ from a light-emitting position of a second emission layer to the device light-emitting surface, and film thicknesses of a plurality of layers between the light-emitting surface and the first emission layer, the first emission layer and the second emission layer are set so as to increase the luminous intensity of color of an emission produced by mixing an emission from the first emission layer with an emission from the second emission layer.

14 Claims, 9 Drawing Sheets

EL EMISSION

FIG.3

| | GLASS SUB-STRATE | TRNAS-PARENT ANODE | HOLE INJECTING LAYER | | HOLE TRANSPORT LAYER | ORANGE EMISSION LAYER | | BLUE EMISSION LAYER | | ELECTRON TRANSPORT LAYER | ELECTRON INJECTING LAYER/CATHODE |
|---|---|---|---|---|---|---|---|---|---|---|---|
| | Glass (mm) | ITO (nm) | CuPC (nm) | CFx (nm) | NPB (nm) | NPB (nm) | DBzR (%) | TBADN (nm) | TBP (%) | Alq3 (nm) | LiF/Al (nm/nm) |
| COMPARATIVE EXAMPLE 2 | 0.7 | 85 | 10 | 2 | 70 | 10 | 3% | 60 | 5% | 10 | 1/200 |
| COMPARATIVE EXAMPLE 1 | 0.7 | 85 | 10 | 2 | 70 | 10 | 3% | 20 | 5% | 10 | 1/200 |
| FIRST EMBODIMENT | 0.7 | 85 | 10 | 2 | 65 | 10 | 3% | 35 | 5% | 10 | 1/200 |

FIG.4

| | | Glass | ITO | CuPc+CFx | NPB | NPB+DBzR | TBADN+TBP | Alq3 | TOTAL OPTICAL FILM THICKNESS | DIGIMAL FRACTION OF m VALUE | λ(nm) |
|---|---|---|---|---|---|---|---|---|---|---|---|
| COMPARATIVE EXAMPLE 2 | FILM THICKNESS (nm) | 7000000 | 85 | 12 | 70 | 10 | 60 | 10 | | | |
| | OPTICAL DISTANCE OF RED | 10850000 | 153 | 13.2 | 126 | 18 | | | 10850310 | 0.528 | 570 |
| | OPTICAL DISTANCE OF BLUE | 10850000 | 170 | 19.2 | 126 | 18 | 108 | | 10850441 | 0.663 | 460 |
| | OPTICAL DISTANCE OF GREEN | 10850000 | 170 | 18 | 126 | 18 | 108 | | 10850440 | 0.490 | 510 |
| COMPARATIVE EXAMPLE 1 | FILM THICKNESS (nm) | 7000000 | 85 | 12 | 70 | 10 | 20 | 10 | | | |
| | OPTICAL DISTANCE OF RED | 10850000 | 153 | 13.2 | 126 | 18 | | | 10850310 | 0.528 | 570 |
| | OPTICAL DISTANCE OF BLUE | 10850000 | 170 | 19.2 | 126 | 18 | 36 | | 10850369 | 0.037 | 460 |
| | OPTICAL DISTANCE OF GREEN | 10850000 | 170 | 18 | 126 | 18 | 36 | | 10850368 | 0.925 | 510 |
| FIRST EMBODIMENT | FILM THICKNESS (nm) | 700000 | 85 | 12 | 65 | 10 | 35 | 10 | | | |
| | OPTICAL DISTANCE OF RED | 1085000 | 153 | 13.2 | 117 | 18 | | | 1085301.2 | 0.149 | 570 |
| | OPTICAL DISTANCE OF BLUE | 1085000 | 170 | 19.2 | 117 | 18 | 63 | | 1085387.2 | 0.150 | 460 |
| | OPTICAL DISTANCE OF GREEN | 1085000 | 170 | 18 | 117 | 18 | 63 | | 1085386 | 0.831 | 510 |

INDEX OF REFRACTION OF EACH LAYER AT EACH WAVELENGTH OF RED, GREEN AND BLUE

| MEASURED WAVELENGTH(nm) | Glass | ITO | CuPC+CFx | NPB | NPB+DBzR | TBADN+TBP |
|---|---|---|---|---|---|---|
| 570(RED) | 1.55 | 1.8 | 1.1 | 1.8 | 1.8 | 1.8 |
| 460(BLUE) | 1.55 | 2 | 1.6 | 1.8 | 1.8 | 1.8 |
| 510(GREEN) | 1.55 | 2 | 1.5 | 1.8 | 1.8 | 1.8 |

| | OPERATING VOLTAGE | CHROMATICITY | | LUMINOUS EFFICIENCY |
|---|---|---|---|---|
| | (V) | CIE X | CIE Y | (cd/A) |
| COMPARATIVE EXAMPLE 2 | 6.78 | 0.25 | 0.29 | 8.62 |
| COMPARATIVE EXAMPLE 1 | 6.58 | 0.27 | 0.32 | 11.16 |
| FIRST EMBODIMENT | 6.35 | 0.29 | 0.39 | 13.31 |

EL EMISSION

FIG.11

| | GLASS SUB-STRATE | TRNAS-PARENT ANODE | HOLE INJECTING LAYER | | HOLEL TRANSPORT LAYER | ORAMGE EMISSION LAYER | | BLUE EMISSION LAYER | | ELECTRON TRANSPORT LAYER | ELECTRON INJECTING LAYER/CATHODE |
|---|---|---|---|---|---|---|---|---|---|---|---|
| | Glass (mm) | ITO (nm) | CuPC (nm) | CFx (nm) | NPB (nm) | NPB (nm) | DBzR (%) | TBADN (nm) | TBP (%) | Alq3 (nm) | LiF/Al (nm/nm) |
| COMPARATIVE EXAMPLE 1 | 0.7 | 85 | 10 | 2 | 50 | 10 | 3% | 95 | 5% | 10 | 1/200 |
| COMPARATIVE EXAMPLE 2 | 0.7 | 85 | 10 | 2 | 40 | 10 | 3% | 75 | 5% | 10 | 1/200 |
| SECOND EMBODIMENT | 0.7 | 85 | 10 | 2 | 60 | 10 | 3% | 75 | 5% | 10 | 1/200 |

FIG.12

|  |  | Glass | ITO | CuPC+CFx | NPB | NPB+DB2R | TBADN+TBP | Alq3 | TOTAL OPTICAL FILM THICKNESS | DICIMAL FRACTION OF m VALUE | λ (nm) |
|---|---|---|---|---|---|---|---|---|---|---|---|
| COMPARATIVE EXAMPLE 1 | FILM THICKNESS (nm) | 700000 | 85 | 12 | 50 | 10 | 95 | 10 |  |  |  |
|  | OPTICAL DISTANCE OF RED | 1085000 | 153 | 13.2 | 90 | 18 |  |  | 1085274.2 | 0.959 | 570 |
|  | OPTICAL DISTANCE OF BLUE | 1085000 | 170 | 19.2 | 90 | 18 | 171 |  | 1085387.2 | 0.150 | 460 |
|  | OPTICAL DISTANCE OF GREEN | 1085000 | 170 | 18 | 90 | 18 | 171 |  | 1085386 | 0.831 | 510 |
| COMPARATIVE EXAMPLE 2 | FILM THICKNESS (nm) | 700000 | 85 | 12 | 40 | 10 | 75 | 10 |  |  |  |
|  | OPTICAL DISTANCE OF RED | 1085000 | 153 | 13.2 | 72 | 18 |  |  | 1085256.2 | 0.833 | 570 |
|  | OPTICAL DISTANCE OF BLUE | 1085000 | 170 | 19.2 | 72 | 18 | 135 |  | 1085333.2 | 0.680 | 460 |
|  | OPTICAL DISTANCE OF GREEN | 1085000 | 170 | 18 | 72 | 18 | 135 |  | 1085332 | 0.408 | 510 |
| SECOND EMBODIMENT | FILM THICKNESS (nm) | 700000 | 85 | 12 | 60 | 10 | 75 | 10 |  |  |  |
|  | OPTICAL DISTANCE OF RED | 1085000 | 153 | 13.2 | 108 | 18 |  |  | 1085292.2 | 0.086 | 570 |
|  | OPTICAL DISTANCE OF BLUE | 1085000 | 170 | 19.2 | 108 | 18 | 135 |  | 1085369.2 | 0.993 | 460 |
|  | OPTICAL DISTANCE OF GREEN | 1085000 | 170 | 18 | 108 | 18 | 135 |  | 1085368 | 0.690 | 510 |

INDEX OF REFRACTION OF EACH LAYER AT EACH WAVELENGTH OF RED, GREEN AND BLUE

| MEASURED WAVELENGTH (nm) | Glass | ITO | CuPC+CFx | NPB | NPB+DBzR | TBADN+TBP |
|---|---|---|---|---|---|---|
| 570 (RED) | 1.55 | 1.8 | 1.1 | 1.8 | 1.8 | 1.8 |
| 460 (BLUE) | 1.55 | 2 | 1.6 | 1.8 | 1.8 | 1.8 |
| 510 (GREEN) | 1.55 | 2 | 1.5 | 1.8 | 1.8 | 1.8 |

| | OPERATING VOLTAGE | CHROMATICITY | | LUMINOUS EFFICIENCY |
|---|---|---|---|---|
| | (V) | CIE X | CIE Y | (cd/A) |
| COMPARATIVE EXAMPLE 1 | 5.37 | 0.36 | 0.40 | 8.14 |
| COMPARATIVE EXAMPLE 2 | 5.15 | 0.36 | 0.42 | 7.42 |
| SECOND EMBODIMENT | 6.71 | 0.35 | 0.39 | 10.02 |

LIGHT-EMITTING DEVICE HAVING A PLURALITY OF EMISSION LAYERS

BACKGROUND OF THE INVENTION

1. Field of the Invention

The present invention relates to a light-emitting device, and, more particularly, to a light-emitting device having a plurality of emission layers.

2. Description of the Background Art

In recent years, displays using organic electroluminescent devices (hereinafter referred to as "organic EL devices") as flat-panel display devices have been developed to find applications in a wide variety of information equipment. The organic EL devices are expected to provide flat-panel displays that consume less power than CRTs conventionally and generally used in the art, and are also expected to provide nonpolluting (i.e., mercury-free) illumination devices, which will replace fluorescent lamps, and the like.

In the organic EL device, electrons and holes are injected from an electron injecting electrode and a hole injecting electrode, respectively, into an emission layer, so that the electrons and the holes are recombined in the emission layer so as to bring organic molecules into the excited state. The organic EL device then emits fluorescent light when the excited organic molecules return to the ground state.

In recent years, an organic EL device including a plurality of emission layers adapted to emit different wavelengths of light has been proposed in, for example, Japanese Patent No. 3287344. The organic EL device disclosed in this patent includes a first emission layer that emits orange light, and a second emission layer that emits blue light. The orange light and blue light emitted by the respective emission layers are mixed together to produce a white emission.

Recently, an improvement of the luminous efficiency of the organic EL device has been desired to make the device suitable for practical use. In the case where the white emission is changed or converted through color filters to provide full-color emissions, in particular, the luminous efficiency needs to be further improved in view of an optical loss caused by the color filters.

However, the organic EL device disclosed in the above-mentioned Japanese Patent No. 3287344 may suffer from a problem that each of the first emission layer that produces an orange emission and the second emission layer that produces a blue emission reduces the luminous intensity of light emitted by the other emission layer. In this case, the luminous efficiency may deteriorate. If the organic EL device has a low luminous efficiency, a large amount of current is required to pass through the device, and the device may degrade earlier than expected, resulting in a reduction in the device lifetime.

Also, it is difficult for the organic EL device disclosed in the above-mentioned Japanese Patent No. 3287344 to improve the color purity of blue color and orange color (or red color) due to interference between the blue emission produced by the second emission layer and the orange emission produced by the first emission layer.

SUMMARY OF THE INVENTION

It is therefore an object of the present invention to provide a light-emitting device including a plurality of emission layers, which exhibits improved luminous efficiency and improved device lifetime.

To accomplish the above object, a light-emitting device according to a first aspect of the invention includes a first emission layer formed apart from a light-emitting surface with a plurality of layers interposed therebetween, and having a first maximum wavelength region $\lambda_x$, and a second emission layer formed on the first emission layer to provide a laminated structure and having a second maximum wavelength region $\lambda_y$ that is different from the first maximum wavelength region $\lambda_x$. In this light-emitting device, a first optical film thickness range $L_1$ from a light-emitting position of the first emission layer to the light-emitting surface of the device, a second optical film thickness range $L_2$ from a light-emitting position of the second emission layer to the light-emitting surface, and respective film thicknesses of the plurality of layers, the first emission layer and the second emission layer are set, so as to increase the luminous intensity of color of an emission produced by mixing an emission from the first emission layer with an emission from the second emission layer.

In the light-emitting device according to the first aspect of the invention, the film thicknesses of the plurality of layers, the first emission layer and the second emission layer are respectively set so as to increase the luminous intensity of color of the emission produced by mixing the emission from the first emission layer with the emission from the second emission layer. With this arrangement, the luminous intensity of the color of the emitted light can be improved, resulting in improved luminous efficiency of the light-emitting device including the plurality of emission layers. The improvement in the luminous efficiency eliminates the need to feed a large amount of current to the device, thereby suppressing degradation of the device. Consequently, the lifetime of the light-emitting device including the plurality of emission layers can be improved or prolonged.

In the light-emitting device according to the first aspect of the invention, the optical film thickness range $L_1$ from the light-emitting position of the first emission layer to the light-emitting surface of the device, the optical film thickness range $L_2$ from the light-emitting position of the second emission layer to the light-emitting surface, and the film thicknesses of the plurality of layers, the first emission layer and the second emission layer are preferably set according to the following expressions:

$$L_1 = \lambda_X/4 \times m_1 = n_{11}d_1 + n_{21}d_2 + \ldots + n_{k1}d_k$$

$$L_2 = \lambda_Y/4 \times m_1 = n_{12}d_1 + n_{22}d_2 + \ldots + n_{k2}d_k$$

$m_1$, $m_2$: positive integer equal to or larger than 1 (on conditions that decimal fractions of $m_1$ and $m_2$ are equal to or smaller than 0.2 or equal to or larger than 0.8)

$d_1, d_2, \ldots d_k$: film thickness of each layer $n_{11}, n_{21}, \ldots n_{k1}$: index of refraction of each layer at $\lambda_X$ $n_{12}, n_{22}, \ldots n_{k2}$: index of refraction of each layer at $\lambda_Y$.

With this arrangement, the film thicknesses of the plurality of layers, the first emission layer and the second emission layer can be easily set so as to increase the luminous intensity of the color of the emission produced by mixing the emission from the first emission layer with the emission from the second emission layer.

In this case, the light-emitting position of the first emission layer may be assumed to be one of the opposite surfaces of the first emission layer which is remote from the light-emitting surface of the device, and the light-emitting position of the second emission layer may be assumed to be one of the opposite surfaces of the second emission layer which is remote from the light-emitting surface of the device.

In the light-emitting device according to the first aspect of the invention, the plurality of layers may include a substrate, a transparent anode, a hole injecting layer and a hole transport layer.

In the light-emitting device according to the first aspect of the invention, the first maximum wavelength region $\lambda_X$ of the first emission layer preferably includes a maximum wavelength region $\lambda_1$ of red color, and the second maximum wavelength region $\lambda_Y$ of the second emission layer preferably includes a maximum wavelength region $\lambda_2$ of blue color and a maximum wavelength region $\lambda_3$ of green color. In this case, the first optical film thickness range $L_1$, the second optical film thickness range $L_2$ and the film thicknesses of the plurality of layers, the first emission layer and the second emission layer are preferably set so as to increase the luminous intensity in the respective maximum wavelength regions of red color, green color and blue color. With this arrangement, the luminous intensity can be increased in the respective maximum wavelength regions of red color, green color and blue color, and therefore the luminous intensity of the color of the emission produced by mixing the emission from the first emission layer with the emission from the second emission layer can be easily enhanced.

Preferably, the first emission layer comprises an orange emission layer, the second emission layer comprises a blue emission layer, and the first emission layer and the second emission layer cooperate with each other to produce a white emission. With this arrangement, the orange emission layer and the blue emission layer can easily produce a white emission with improved luminous efficiency, assuring improved device lifetime.

According to a second aspect of the invention, a light-emitting device includes a first emission layer formed apart from a light-emitting surface with a plurality of layers interposed therebetween, and having a first maximum wavelength region $\lambda_X$, and a second emission layer formed on the first emission layer to provide a laminated structure and having a second maximum wavelength region $\lambda_Y$ that is different from the first maximum wavelength region $\lambda_X$. In this light-emitting device, a first optical film thickness range $L_1$ from a light-emitting position of the first emission layer to the light-emitting surface of the device, a second optical film thickness range $L_2$ from a light-emitting position of the second emission layer to the light-emitting surface, and respective film thicknesses of the plurality of layers, the first emission layer and the second emission layer are set according to expressions as follows, so as to increase the luminous intensity of color of an emission produced by mixing an emission from the first emission layer with an emission from the second emission layer:

$$L_1 = \lambda_X/4 \times m_1 = n_{11}d_1 + n_{21}d_2 + \ldots + n_{k1}d_k$$

$$L_2 = \lambda_Y/4 \times m_2 = n_{12}d_1 + n_{22}d_2 + \ldots + n_{k2}d_k$$

$m_1$, $m_2$: positive integer equal to or larger than 1 (on conditions that decimal fractions of $m_1$ and $m_2$ are equal to or smaller than 0.2 or equal to or larger than 0.8)

$d_1, d_2, \ldots d_k$: film thickness of each layer $n_{11}, n_{21}, \ldots n_{k1}$: index of refraction of each layer at $\lambda_X$ $n_{12}, n_{22}, \ldots n_{k2}$: index of refraction of each layer at $\lambda_Y$.

In the light-emitting device according to the second aspect of the invention, the film thicknesses of the plurality of layers, the first emission layer and the second emission layer are respectively set according to the above-indicated expressions, so as to increase the luminous intensity of the color of the emission produced by mixing the emission from the first emission layer with the emission from the second emission.

With this arrangement, the luminous intensity of the color of the emitted light can be improved, resulting in improved luminous efficiency of the light-emitting device including the plurality of emission layers. The improvement in the luminous efficiency eliminates the need to feed a large amount of current to the device, thereby suppressing degradation of the device. Consequently, the lifetime of the light-emitting device including the plurality of emission layers can be improved.

According to a third aspect of the invention, a light-emitting device includes a first emission layer formed through a plurality of layers from a light-emitting surface, and having a first maximum wavelength region $\lambda_X$, and a second emission layer formed on the first emission layer to provide a laminated structure and having a second maximum wavelength region $\lambda_Y$ that is different from the first maximum wavelength region $\lambda_X$. In this light-emitting device, a first optical film thickness range $L_1$ from a light-emitting position of the first emission layer to the light-emitting surface of the device, a second optical film thickness range $L_2$ from a light-emitting position of the second emission layer to the light-emitting surface, and respective film thicknesses of the plurality of layers, the first emission layer and the second emission layer are set, so as to increase the luminous intensity in the first maximum wavelength region $\lambda_X$ of an emission spectrum provided by the first emission layer, and increase the luminous intensity in the second maximum wavelength region $\lambda_Y$ of an emission spectrum provided by the second emission layer.

In the light-emitting device according to the third aspect of the invention, the film thicknesses of the plurality of layers, the first emission layer and the second emission layer are respectively set so as to increase the luminous intensity in the first maximum wavelength region $\lambda_X$ of the emission spectrum provided by the first emission layer, and increase the luminous intensity in the second maximum wavelength region $\lambda_Y$ of the emission spectrum provided by the second emission layer. With this arrangement, the luminous intensity in the first maximum wavelength region $\lambda_X$ of the emission spectrum associated with the first emission layer and the luminous intensity in the second maximum wavelength region $\lambda_Y$ of the emission spectrum associated with the second emission layer can be respectively increased, and therefore the color purity of light emitted by the first emission layer and the color purity of light emitted by the second emission layer can be improved.

In the light-emitting device according to the third aspect of the invention, the optical film thickness range $L_1$ from the light-emitting position of the first emission layer to the light-emitting surface of the device, the optical film thickness range $L_2$ from the light-emitting position of the second emission layer to the light-emitting surface, and the film thicknesses of the plurality of layers, the first emission layer and the second emission layer are preferably set according to expressions as follows:

$$L_1 = \lambda_X/4 \times m_1 = n_{11}d_1 + n_{21}d_2 + \ldots + n_{k1}d_k$$

$$L_2 = \lambda_Y/4 \times m_2 = n_{12}d_1 + n_{22}d_2 + \ldots + n_{k2}d_k$$

$m_1$, $m_2$: positive integer equal to or larger than 1 (on conditions that decimal fractions of $m_1$ and $m_2$ are equal to or smaller than 0.2 or equal to or larger than 0.8)

$d_1, d_2, \ldots d_k$: film thickness of each layer $n_{11}, n_{21}, \ldots n_{k1}$: index of refraction of each layer at $\lambda_X$ $n_{12}, n_{22}, \ldots n_{k2}$: index of refraction of each layer at $\lambda_Y$.

With this arrangement, the film thicknesses of the plurality of layers, the first emission layer and the second emission layer can be easily set so as to increase the luminous intensity in the first maximum wavelength region $\lambda_X$ of the emission spectrum provided by the first emission layer, and increase the luminous intensity in the second maximum wavelength region $\lambda_Y$ of the emission spectrum provided by the second emission layer.

In this case, the light-emitting position of the first emission layer is preferably assumed to be one of the opposite surfaces of the first emission layer which is remote from the light-emitting surface of the device, and the light-emitting position of the second emission layer is preferably assumed to be one of the opposite surfaces of the second emission layer which is remote from the light-emitting surface of the device.

In the light-emitting device according to the third aspect of the invention, the plurality of layers may include a substrate, a transparent anode, a hole injecting layer and a hole transport layer.

In the light-emitting device according to the third aspect of the invention, the first maximum wavelength region $\lambda_X$ of the first emission layer preferably includes a maximum wavelength region $\lambda_1$ of red color, and the second maximum wavelength region $\lambda_Y$ of the second emission layer preferably includes a maximum wavelength region $\lambda_2$ of blue color and a maximum wavelength region $\lambda_3$ of green color. In this case, the first optical film thickness range $L_1$, the second optical film thickness range $L_2$ and the film thicknesses of the plurality of layers, the first emission layer and the second emission layer are preferably set so as to increase the luminous intensity in the maximum wavelength regions of red color and blue color. With this arrangement, the luminous intensity can be increased in the maximum wavelength regions of red color and blue color, and therefore the color purity of red color and blue color can be improved in the case where color filters are used.

Preferably, the first emission layer comprises an orange emission layer, the second emission layer comprises a blue emission layer, and the first emission layer and the second emission layer cooperate with each other to produce a white emission. With this arrangement, when the white emission produced by the orange emission layer and the blue emission layer is changed or converted into full-color emissions by means of color filters, the color purity of red color and blue color can be improved.

According to a fourth aspect of the invention, a light-emitting device includes a first emission layer formed apart from a light-emitting surface with a plurality of layers interposed therebetween, and having a first maximum wavelength region $\lambda_X$, and a second emission layer formed on the first emission layer to provide a laminated structure and having a second maximum wavelength region $\lambda_Y$ that is different from the first maximum wavelength region $\lambda_X$. In this light-emitting device, a first optical film thickness range $L_1$ from a light-emitting position of the first emission layer to the light-emitting surface of the device, a second optical film thickness range $L_2$ from a light-emitting position of the second emission layer to the light-emitting surface, and respective film thicknesses of the plurality of layers, the first emission layer and the second emission layer are set according to expressions as follows, so as to increase the luminous intensity in the first maximum wavelength region $\lambda_X$ of an emission spectrum provided by the first emission layer, and increase the luminous intensity in the second maximum wavelength region $\lambda_y$ of an emission spectrum provided by the second emission layer:

$L_1 = \lambda_X/4 \times m_1 = n_{11}d_1 + n_{21}d_2 + \ldots + n_{k1}d_k$ $L_2 = \lambda_Y/4 \times m_2 = n_{12}d_1 + n_{22}d_2 + \ldots + n_{k2}d_k$ $m_1$, $m_2$: positive integer equal to or larger than 1 (on conditions that decimal fractions of $m_1$ and $m_2$ are equal to or smaller than 0.2 or equal to or larger than 0.8)

$d_1, d_2, \ldots d_k$: film thickness of each layer $n_{11}, n_{21}, \ldots n_{k1}$: index of refraction of each layer at $\lambda_X$ $n_{12}, n_{22}, \ldots n_{k2}$: index of refraction of each layer at $\lambda_Y$.

In the light-emitting device according to the fourth aspect of the invention, the film thicknesses of the plurality of layers, the first emission layer and the second emission layer are respectively set so as to increase the luminous intensity in the first maximum wavelength region $\lambda_X$ of the emission spectrum provided by the first emission layer, and increase the luminous intensity in the second maximum wavelength region $\lambda_Y$ of the emission spectrum provided by the second emission layer. With this arrangement, the luminous intensity in the first maximum wavelength region $\lambda_X$ of the emission spectrum associated with the first emission layer and the luminous intensity in the second maximum wavelength region $\lambda_Y$ of the emission spectrum associated with the second emission layer can be respectively increased, and therefore the color purity of light emitted by the first emission layer and the color purity of light emitted by the second emission layer can be improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a table indicating the compositions and film thicknesses of respective layers of the organic EL device of the first embodiment, and those of Comparative Example 1 and Comparative Example 2;

FIG. 4 is a table indicating m values of the organic EL devices according to the first embodiment, Comparative Example 1 and Comparative Example 2, with respect to different wavelengths of light emitted by the devices;

FIG. 11 is a table indicating the compositions and film thicknesses of respective layers of the organic EL device of the second embodiment, and those of Comparative Example 1 and Comparative Example 2;

FIG. 12 is a table indicating m values of the organic EL devices according to the second embodiment, Comparative Example 1 and Comparative Example 2, with respect to different wavelengths of light emitted by the devices;

DESCRIPTION OF THE PREFERRED EMBODIMENTS

Some embodiments of the present invention will be described with reference to the drawings.

First Embodiment

Figure 1:
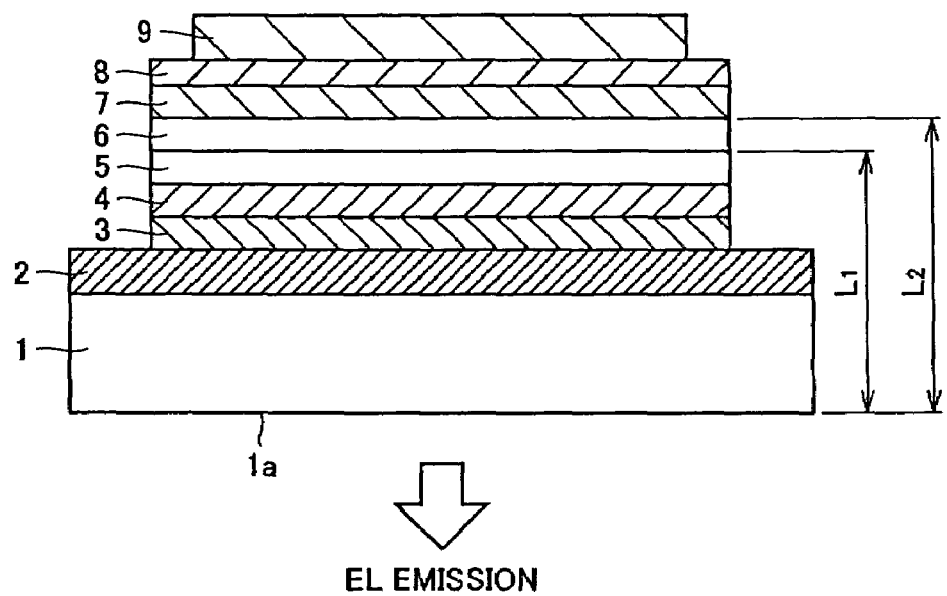
FIG. 1 is a cross-sectional view showing an organic EL device according to a first embodiment of the present invention.

Referring first to FIG. 1, the structure of an organic EL device constructed according to a first embodiment of the invention will be described. In the organic EL device of the first embodiment, a transparent anode 2 composed of ITO (Indium Tin Oxide) is formed on a glass substrate 1. On the transparent anode 2 is formed a hole injecting layer 3 having a laminated structure of a CuPC (Copper (II) phthalocyanine) film and a fluorocarbon polymer film ($CF_x$). A hole transport layer 4 composed of NPB (N,N'-Di(naphthalene-1-yl)-N,N'-diphenyl benzidine) is formed on the hole injecting layer 3. On the hole transport layer 4 is formed an orange emission layer 5 formed by doping NPB as a host material with DBzR (5,12-Bis(4-(6-methylbenzothiazol-2-yl)phenyl)-6,11-diphenylnaphthacene)as a luminescent dopant material. On the orange emission layer 5 is formed a blue emission layer 6 formed by doping TBADN (2-tert Butyl-9,10-di(2-naphthyl) anthracene) as a host material with TBP (1,4,7,10-Tetra-tert butyl perylene) as a luminescent dopant material.

It is to be noted that the orange emission layer 5 is an example of the "first emission layer" of the present invention, and the blue emission layer 6 is an example of the "second emission layer" of the invention. Here, the orange emission layer 5 emits light having a maximum wavelength region $\lambda_1$ (560 nm–630 nm) corresponding to red color (R). The blue emission layer 6 emits light having two maximum wavelength regions, i.e., a maximum wavelength region $\lambda_2$ (430 nm–480 nm) corresponding to blue color (B), and a maximum wavelength region $\lambda_3$ (480 nm–550 nm) corresponding to green color (G).

An electron transport layer 7 composed of Alq3 (Tris (8-hydroxyquinolinato) aluminum) is formed on the blue emission layer 6. An electron injecting layer 8 composed of LiF is formed on the electron transport layer 7. A cathode 9 composed of Al is formed on the electron injecting layer 8.

Figure 2:
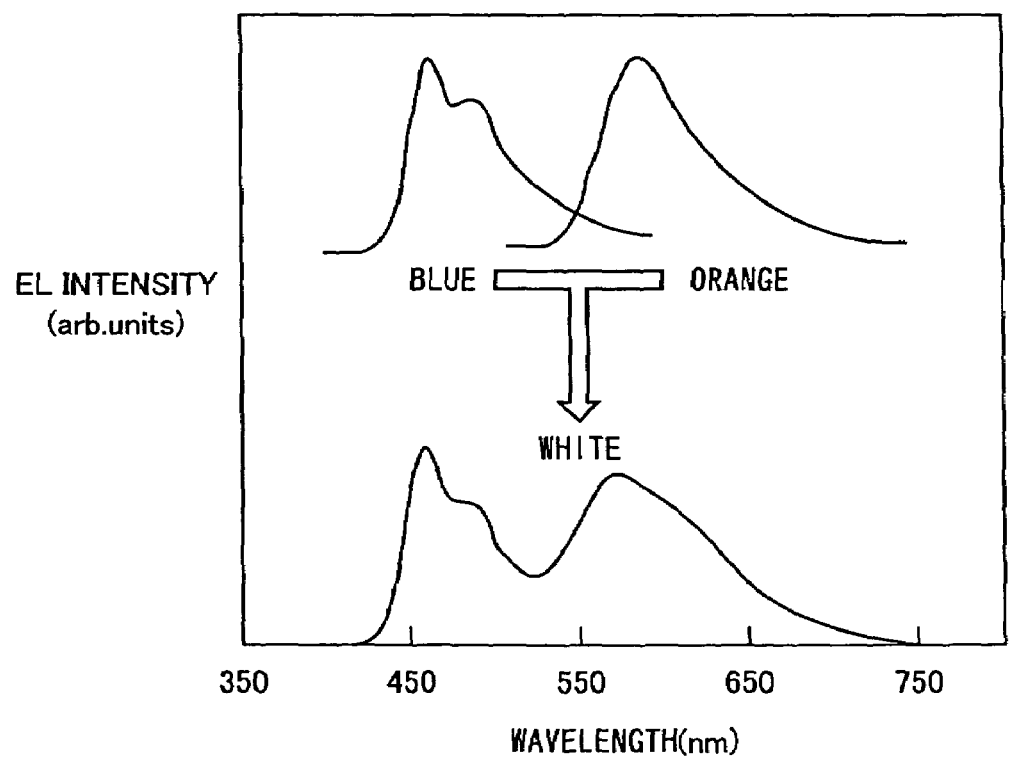
FIG. 2 is a characteristic diagram useful for explaining the color (white) of an emission produced by the organic EL device of the first embodiment shown in FIG. 1.

As shown in FIG. 2, the organic EL device is able to produce a white emission that results from combination of an emission from the orange emission layer 5 and an emission from the blue emission layer 6. The white light thus produced is emitted or radiated from a light-emitting surface 1a of the glass substrate 1, which provides a light-emitting surface of the organic EL device. In the case where color filters (not shown) are used, full-color light emissions of red color (R), green light (G) and blue color (B) can be produced.

In the organic EL device according to the first embodiment, the film thicknesses of the glass substrate 1, transparent anode 2, hole injecting layer 3, hole transport layer 4, orange emission layer 5 and the blue emission layer 6 are respectively set so as to increase the luminous intensity of the white emission produced by mixing the emission from the orange emission layer 5 with the emission from the blue emission layer 6.

In FIG. 1, an optical film thickness range $L_1$ represents a distance from the red (R) light-emitting position of the orange emission layer 5 (i.e., the upper surface of the orange emission layer 5 in FIG. 1) to the light-emitting surface 1a, and an optical film thickness range $L_2$ represents a distance from the blue (B) light-emitting position of the blue emission layer 6 (i.e., the upper surface of the blue emission layer 6 in FIG. 1) to the light-emitting surface 1a, while an optical film thickness range $L_3$ represents a distance from the green (G) light-emitting position of the blue emission layer 6 (i.e., the upper surface of the blue emission layer 6 in FIG. 1) to the light-emitting surface 1a. These optical film thickness ranges $L_1$, $L_2$ and $L_3$ and the film thicknesses of the glass substrate 1, transparent anode 2, hole injecting layer 3, hole transport layer 4, orange emission layer 5 and the blue emission layer 6 are respectively set according to the following expressions (1), so as to increase the luminous intensity in three maximum wavelength regions, i.e., the maximum wavelength region $\lambda_1$ (560 nm–630 nm) corresponding to red (R) light emitted by the orange emission layer 5, the maximum wavelength region $\lambda_2$ (430 nm–480 nm) corresponding to blue (B) light emitted by the blue emission layer 6, and the maximum wavelength region $\lambda_3$ (480 nm–550 nm) corresponding to green (G) light emitted by the blue emission layer 6.

$$L_1 = \lambda_1/4 \times m_1 = n_{11}d_1 + n_{21}d_2 + n_{31}d_3 + n_{41}d_4 + n_{51}d_5$$

$$L_2 = \lambda_2/4 \times m_2 = n_{12}d_1 + n_{22}d_2 + n_{32}d_3 + n_{42}d_4 + n_{52}d_5 n_{62}d_6$$

$$L_3 = \lambda_3/4 \times m_3 = n_{13}d_1 + n_{23}d_2 + n_{33}d_3 + n_{43}d_4 + n_{53}d_5 + n_{63}d_6 \quad (1)$$

$m_1$, $m_2$, $m_3$: positive integer equal to or larger than 1 (on conditions that decimal fractions of $m_1$, $m_2$ and $m_3$ are equal to or smaller than 0.2 or equal to or larger than 0.8)

$d_1$, $d_2$, $d_3$, $d_4$, $d_5$, $d_6$: film thickness of each layer $n_{11}$, $n_{21}$, $n_{31}$, $n_{41}$, $n_{51}$: index of refraction of each layer at $\lambda_1$ $n_{12}$, $n_{22}$, $n_{32}$, $n_{42}$, $n_{52}$, $n_{62}$: index of refraction of each layer at $\lambda_2$ $n_{13}$, $n_{23}$, $n_{33}$, $n_{43}$, $n_{53}$, $n_{63}$: index of refraction of each layer at $\lambda_3$ FIG. 3 shows the compositions and film thicknesses of organic layers of the first embodiment obtained by using the above-indicated expressions (1), and those of Comparative Example 1 and Comparative Example 2 that do not satisfy the above expressions (1). As shown in FIG. 3, the film thicknesses of the hole transport layer 4 and the blue emission layer 6 of the first embodiment are respectively different from those of Comparative Example 1 and Comparative Example 2.

In FIG. 4, the maximum wavelength $\lambda_1$ corresponding to red color (R) is set to 570 nm, and the maximum wavelength $\lambda_2$ corresponding to blue color (B) is set to 460 nm, while the maximum wavelength $\lambda_3$ corresponding to green light (G) is set to 510 nm. With the maximum wavelengths set to these values, m values ($m_1$, $m_2$, $m_3$) for the respective wavelengths are calculated according to the above expressions (1) by substituting values shown in FIG. 5 for the indices of refraction $n_{11}$–$n_{51}$, $n_{12}$–$n_{62}$, $n_{13}$–$n_{63}$ of the glass substrate 1, transparent anode 2, hole injecting layer 3, hole transport layer 4, orange emission layer 5 and the blue emission layer 6 with respect to the respective wavelengths.

As shown in FIG. 4, in the first embodiment, the decimal fractions of all of the m values ($m_1$, $m_2$, $m_3$) are equal to or smaller than 0.2 or equal to or larger than 0.8, and thus satisfy the conditions of the above-indicated expressions (1). In Comparative Example 1 and Comparative Example 2, on the other hand, the decimal fractions of some of the m values ($m_1$, $m_2$, $m_3$) are neither equal to or smaller than 0.2 nor equal to or larger than 0.8, and thus do not satisfy the conditions of the above expressions (1).

Figures 5, 6, 7:
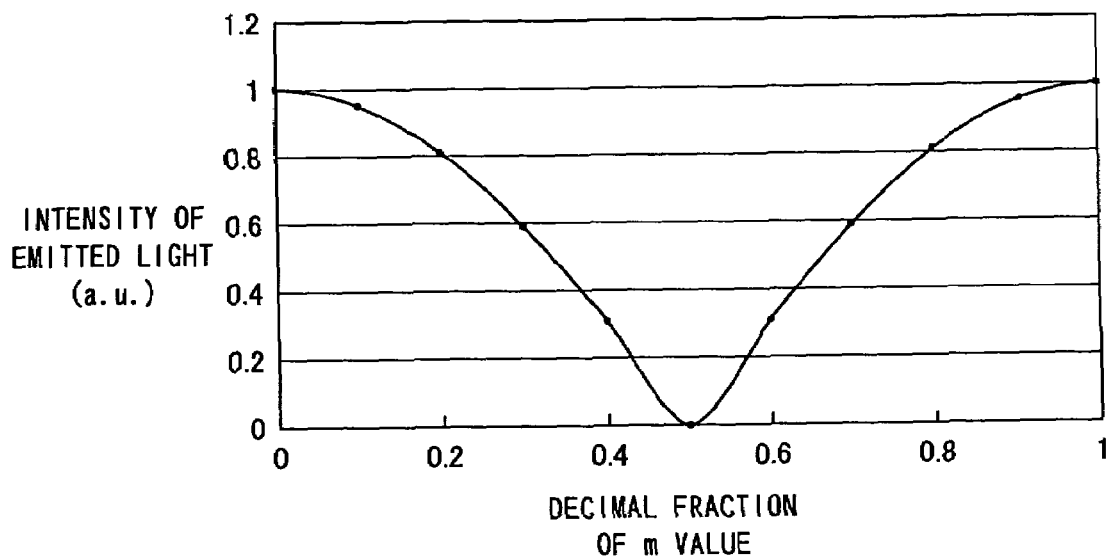
FIG. 5 is a characteristic table indicating the indices of refraction of respective layers of the organic EL devices according to the first embodiment, Comparative Example 1 and Comparative Example 2, with respect to different wavelengths of light emitted by the devices.
FIG. 6 is a graph indicating the relationship between the decimal fractions of m values of the organic EL device according to the first embodiment of the invention, and the intensity of light emitted by the device.
FIG. 7 is a characteristic table indicating the operating voltage, chromaticity and luminous efficiency of the organic EL devices according to the first embodiment, Comparative Example 1 and Comparative Example 2.

FIG. 6 shows the relationship between the decimal values of the m values and the intensity of light emitted by the organic EL device. It is understood from FIG. 6 that the luminous intensity increases as the m value is closer to an integer. In the present embodiment, therefore, the decimal fractions of the m values are set within a range that is equal to or smaller than 0.2 or within a range that is equal to or larger than 0.8 in the above expressions (1), so that the luminous intensity is increased.

FIG. 7 shows the operating voltage, chromaticity, and luminous efficiency of each of the organic EL devices according to the first embodiment, Comparative Example 1 and Comparative Example 2. It is understood from FIG. 7 that, in the first embodiment, the film thicknesses of the respective layers 1–6 are set so as to satisfy the above-indicated expressions (1), thus assuring improved luminous efficiency as compared with those of Comparative Example 1 and Comparative Example 2. Also, in the first embodiment, the operating voltage measured when a given current passes through the device is reduced as compared with those of Comparative Example 1 and Comparative Example 2. With regard to the chromaticity, however, the chromaticity obtained by Comparative Example 1 and Comparative Example 2 is closer to the optimum chromaticity (CIE X: 0.315, CIE Y: 0.315) of white color than the chromaticity obtained by the organic EL device of the first embodiment, which means that Comparative Example 1 and Comparative Example 2 provide higher purity of white color than the first embodiment.

Figure 8:
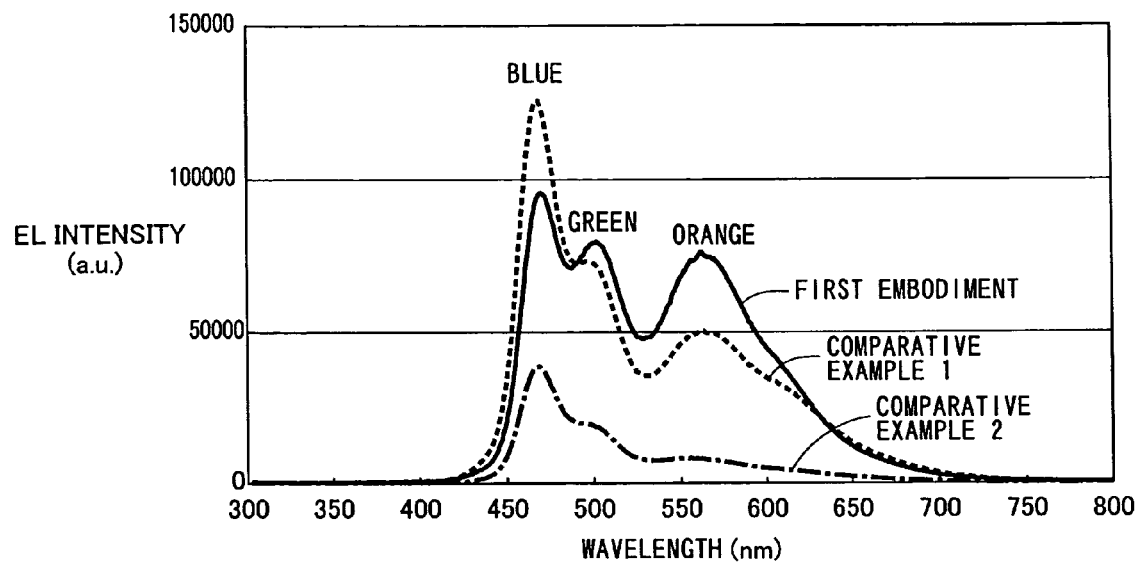
FIG. 8 is a graph showing the EL intensity of the organic EL devices according to the first embodiment, Comparative Example 1 and Comparative Example 2, with respect to wavelength.

Referring to FIG. 8, it is understood that, in the first embodiment that satisfies the above-indicated expressions (1), the EL intensity in the blue, green and orange (or red) regions of the emission spectrum is similarly at high levels, and the peak intensities of R (red), G (green) and B (blue) are generally at the same level. In Comparative Example 1 that does not satisfy the above expressions (1), on the other hand, the EL intensity is at a high level only in the blue region of the emission spectrum, and is at a low level in the orange (or red) region of the emission spectrum. Also, in Comparative Example 2 that does not satisfy the above expressions (1), the EL intensity is at low levels over the entire wavelength region, namely, in all of the blue, green and orange (red) regions of the emission spectrum.

Figure 9:
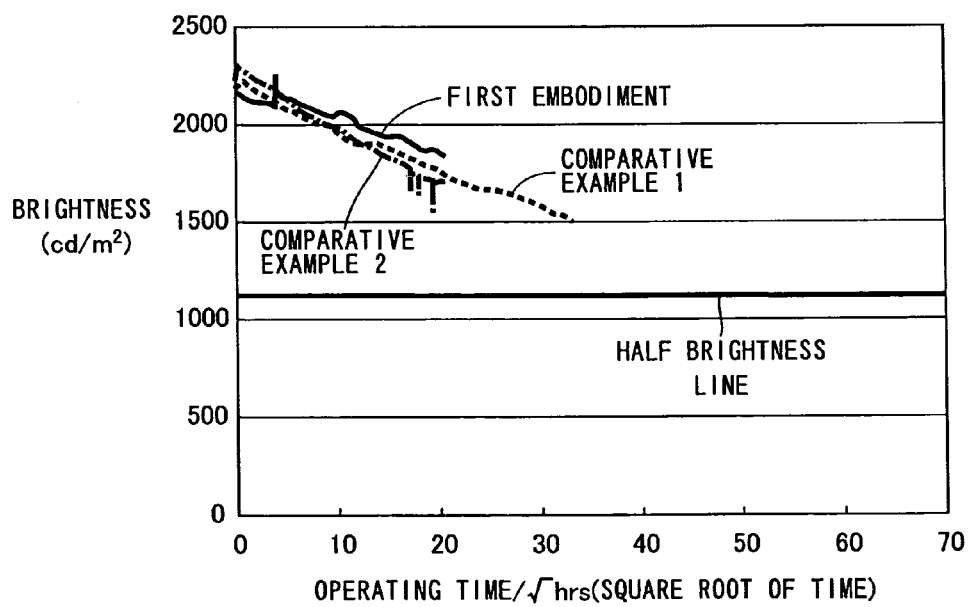
FIG. 9 is a graph showing the brightness of the organic EL devices according to the first embodiment, Comparative Example 1 and Comparative Example 2, with respect to the operating time of the device.

It is also understood from FIG. 9 that the brightness is higher in the first embodiment that satisfies the above-indicated expressions (1), than those of Comparative Example 1 and Comparative Example 2 that do not satisfy the above expressions (1). It can also be said from FIG. 9 that the device lifetime (half brightness life:the time it takes until the brightness decreases to half) is improved or prolonged in the first embodiment that those of Comparative Example 1 and Comparative Example 2. This is because the improvement in the luminous efficiency eliminates the need to pass a large amount of current through the device, thereby suppressing degradation of the device.

In the first embodiment as described above, the film thicknesses of the glass substrate 1, transparent anode 2, hole injecting layer 3, hole transport layer 4, orange emission layer 5 and the blue emission layer 6 are respectively set according to the above-indicated expressions (1), so as to increase the luminous intensity in each of the three maximum wavelength regions, i.e., the maximum wavelength region $\lambda_1$ (560 nm–630 nm) corresponding to red color (R) of the orange emission layer 5, the maximum wavelength region $\lambda_2$ (430 nm–480 nm) corresponding to blue light (B) of the blue emission layer 6, and the maximum wavelength region $\lambda_3$ (480 nm–550 nm) corresponding to green light (G) of the blue emission layer 6. With the film thicknesses of the respective layers 1–6 thus determined, the luminous intensity of the white emission produced by mixing the emission from the orange emission layer 5 with the emission from the blue emission layer 6 can be improved. Consequently, the organic EL device including a plurality of emission layers exhibits improved luminous efficiency and improved device lifetime.

Second Embodiment

Figure 10:
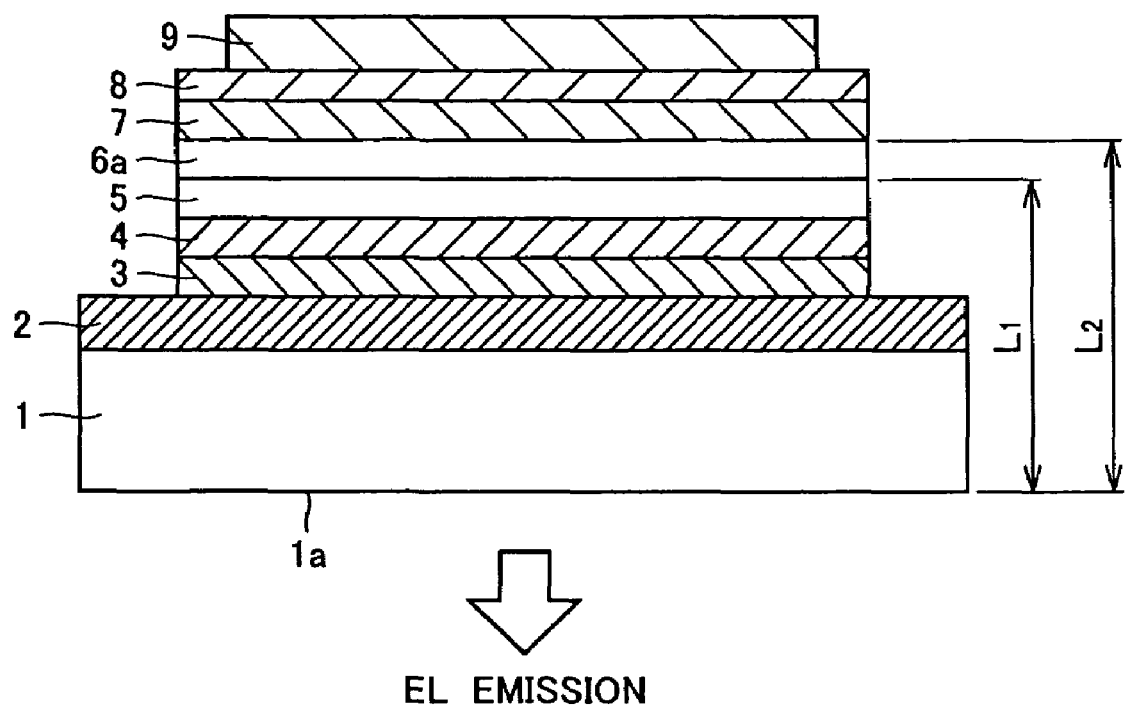
FIG. 10 is a cross-sectional view showing an organic EL device according to a second embodiment of the present invention.

Referring next to FIG. 10, a second embodiment of the invention will be described. In contrast to the first embodiment in which the luminous intensity of the organic EL device is improved, the color purity is improved in the organic EL device of the second embodiment.

In the organic EL device according to the second embodiment, a transparent anode 2 composed of ITO is formed on a glass substrate 1, as shown in FIG. 10. On the transparent anode 2 is formed a hole injecting layer 3 having a laminated structure of a CuPC film and a $CF_X$ film. A hole transport layer 4 composed of NPB is formed on the hole injecting layer 3. An orange emission layer 5 formed by doping NPB as a host material with DBzR as a luminescent dopant is formed on the hole transport layer 4. A blue emission layer 6a obtained by doping TBADN as a host material with TBP as a luminescent dopant is formed on the orange emission layer 5. The blue emission layer 6a is an example of the "second emission layer" of the present invention.

An electron transport layer 7 composed of Alq3 is formed on the blue emission layer 6a. An electron injecting layer 8 composed of LiF is formed on the electron transport layer 7. A cathode 9 composed of Al is formed on the electron injecting layer 8.

In the organic EL device according to the second embodiment, the orange emission layer 5 and the blue emission layer 6a cooperate with each other to produce a white emission. The white light thus produced is emitted or radiated from a light-emitting surface 1a of the glass substrate 1. In the case where color filters (not shown) are used, full-color emissions of red color (R), green light (G) and blue color (B) can be produced.

In the second embodiment, the film thicknesses of the glass substrate 1, transparent anode 2, hole injecting layer 3, hole transport layer 4, orange emission layer 5 and the blue emission layer 6a are respectively set so as to improve the color purity of an emission produced by the orange emission layer 5 and the color purity of an emission produced by the blue emission layer 6a.

In FIG. 10, an optical film thickness range $L_1$ represents a distance from the red (R) light-emitting position of the orange emission layer 5 (i.e., the upper surface of the orange emission layer 5 in FIG. 10) to the light-emitting surface 1a, and an optical film thickness range $L_2$ represents a distance from the blue (B) light-emitting position of the blue emission layer 6 (i.e., the upper surface of the blue emission layer 6 in FIG. 10) to the light-emitting surface 1a. These optical film thickness ranges $L_1$ and $L_2$ and the film thicknesses $d_1$, $d_2$, $d_3$, $d_4$, $d_5$ and $d_6$ of the glass substrate 1, transparent anode 2, hole injecting layer 3, hole transport layer 4, orange emission layer 5 and the blue emission layer 6a are respectively set according to the following expressions (2), so as to increase the luminous intensity in two maximum wavelength regions, namely, in the maximum wavelength region $\lambda_1$ (560 nm–630 nm) corresponding to red (R) light emitted by the orange emission layer 5 and the maximum wavelength region $\lambda_2$ (430 nm–480 nm) corresponding to blue (B) light emitted by the blue emission layer 6a.

$$L_1 = \lambda_1/4 \times m_1 = n_{11}d_1 + n_{21}d_2 + n_{31}d_3 + n_{41}d_4 + n_{51}d_5$$

$$L_2 = \lambda_2/4 \times m_2 = n_{12}d_2 + n_{22}d_2 + n_{32}d_3 + n_{42}d_4 + n_{52}d_5 + n_{62}d_6 \quad (2)$$

$m_1$, $m_2$: positive integer equal to or larger than 1 (on conditions that decimal fractions of $m_1$ and $m_2$ are equal to or smaller than 0.2 or equal to or larger than 0.8)

$d_1$, $d_2$, $d_3$, $d_4$, $d_5$, $d_6$: film thickness of each layer $n_{11}$, $n_{21}$, $n_{31}$, $n_{41}$, $n_{51}$: index of refraction of each layer at $\lambda_1$ $n_{12}$, $n_{22}$, $n_{32}$, $n_{42}$, $n_{52}$, $n_{62}$: index of refraction of each layer at $\lambda_2$ FIG. 11 shows the compositions and film thicknesses of organic layers of the second embodiment that satisfies the conditions of the above-indicated expressions (2), and those of Comparative Example 1 and Comparative Example 2 that do not satisfy the above expressions (2). As shown in FIG. 11, the film thicknesses of the hole transport layer 4 and the blue emission layer 6a of the second embodiment are respectively different from those of Comparative Example 1 and Comparative Example 2.

In FIG. 12, the maximum wavelength $\lambda_1$ corresponding to red color (R) is set to 570 nm, and the maximum wavelength $\lambda_2$ corresponding to blue color (B) is set to 460 nm, while the maximum wavelength $\lambda_3$ corresponding to green light (G) is set to 510 nm. With the maximum wavelengths set to these values, m values ($m_1$, $m_2$, $m_3$) for the respective wavelengths are calculated according to the above expressions (2) by substituting values shown in FIG. 13 for the indices of refraction $n_{11}$–$n_{51}$, $n_{12}$–$n_{62}$ of the glass substrate 1, transparent anode 2, hole injecting layer 3, hole transport layer 4, orange emission layer 5 and the blue emission layer 6 with respect to the respective wavelengths.

In the second embodiment, the luminous intensity is increased only in two wavelength regions, i.e., the maximum wavelength region $\lambda_1$ corresponding to red color (R) and the maximum wavelength region $\lambda_2$ corresponding to blue color (B), and the luminous intensity is not increased in the maximum wavelength region $\lambda_3$ corresponding to green color (G). Namely, the film thicknesses $d_1$–$d_6$ of the respective layers 1–6a are set so as to satisfy the conditions that the decimal fractions of the m values in the above-indicated expressions (2) are equal to or smaller than 0.2 or equal to or larger than 0.8 with respect to the two wavelength regions, i.e., the maximum wavelength region $\lambda_1$ corresponding to red color (R) and the maximum wavelength region $\lambda_2$ corresponding to blue color (B), and not to satisfy the same conditions with respect to the maximum wavelength region $\lambda_3$ corresponding to green color (G).

As shown in FIG. 12, in Comparative Example 1, the decimal fractions of all of the m values ($m_1$, $m_2$) are equal to or smaller than 0.2 or equal to or larger than 0.8, and thus satisfy the conditions of the above-indicated expressions (2). In Comparative Example 2, on the other hand, the decimal fractions of some of the m values ($m_1$, $m_2$, $m_3$) are neither equal to or smaller than 0.2 nor equal to or larger than 0.8, and thus do not satisfy the conditions of the above expressions (2).

Figures 13, 14, 15:
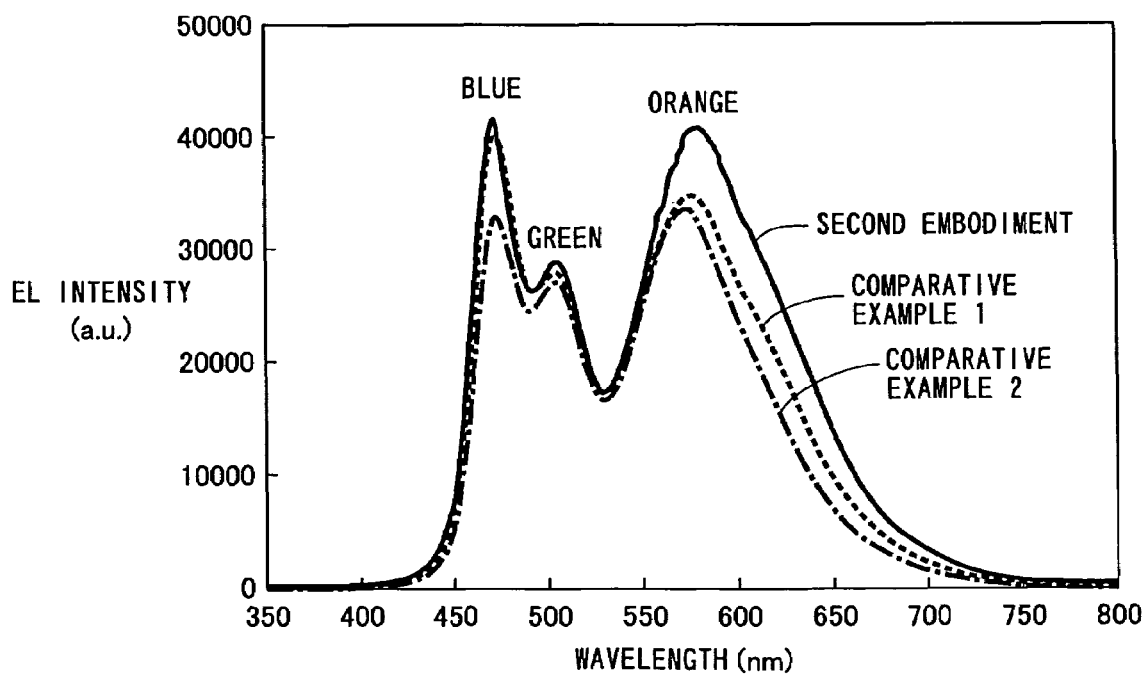
FIG. 13 is a characteristic table indicating the indices of refraction of respective layers of the organic EL devices according to the second embodiment, Comparative Example 1 and Comparative Example 2, with respect to different wavelengths of light emitted by the devices.
FIG. 14 is a characteristic table indicating the operating voltage, chromaticity and luminous efficiency of the organic EL devices according to the second embodiment, Comparative Example 1 and Comparative Example 2.
FIG. 15 is a graph showing the EL intensity of the organic EL devices according to the second embodiment, Comparative Example 1 and Comparative Example 2, with respect to wavelength.

FIG. 14 shows the operating voltage, chromaticity and luminous efficiency of each of the organic EL devices according to the second embodiment, Comparative Example 1 and Comparative Example 2. Referring to FIG. 14, it was found that the chromaticity obtained by the organic EL device of the second embodiment is closer to the optimum chromaticity (CIE X: 0.315, CIE Y: 0.315) of white color than those obtained by Comparative Examples 1 and 2, and thus the organic EL device of the second embodiment is able to produce a white emission with high color purity. Also, the luminous efficiency of the organic EL device of the second embodiment is higher than those of Comparative Example 1 and Comparative Example 2. In the second embodiment, however, the operating voltage is larger than those of Comparative Example 1 and Comparative Example 2, as shown in FIG. 14, since the film thicknesses are set so as to achieve excellent chromaticity.

FIG. 15 shows the EL intensity of light emitted by the organic EL devices of the second embodiment, Comparative Example 1 and Comparative Example 2, with respect to wavelength. It is understood from FIG. 15 that, in the second embodiment, the peaks corresponding to blue color and orange color (or red color) are particularly higher than those of Comparative Example 1 and Comparative Example 2. Where color filters are used, the organic EL device of the second embodiment is able to realize blue color (B) and red color (R) with high color purity.

In the second embodiment as described above, the film thicknesses of the glass substrate 1, transparent anode 2, hole injecting layer 3, hole transport layer 4, orange emission layer 5 and the blue emission layer 6a are respectively set according to the above-indicated expressions (2) so as to increase the luminous intensity in the red (R) region of the emission spectrum corresponding to red light emitted by the orange emission layer 5 and in the blue (B) region of the emission spectrum corresponding to blue light emitted by the blue emission layer 6a. Thus, since the luminous intensity is enhanced in the red (R) region of the emission spectrum associated with the orange emission layer 5 and in the blue (B) region of the emission spectrum associated with the blue emission layer 6a, the organic EL device of the second embodiment is able to produce blue color (B) and red color (R) with high color purity if color filters are used.

It is to be understood that the illustrated embodiments are merely exemplary, and the present invention is not limited to details of the illustrated embodiments. The scope of the invention is not defined by the above description of the embodiments, but defined by the appended claims. It is also to be understood that the invention may be embodied with various changes, modifications, or improvements, without departing from the scope of the invention as defined in the appended claims, and equivalents thereof.

In the first embodiment, the luminous intensity of the organic EL device including two emission layers, i.e., the orange emission layer and the blue emission layer, is improved so as to improve the luminous efficiency and device lifetime. However, the present invention is not limited to this application, but may be applied to organic EL devices having three or more emission layers capable of emitting different wavelengths of light, assuring improved luminous efficiency and device lifetime by using similar methods. For example, the invention is applicable to an organic EL device having three emission layers capable of emitting red (R) light, green (G) light and blue (B) light, respectively.

In the second embodiment, the color purity of red color and blue color is improved in the organic EL device having two emission layers, i.e., the orange emission layer and the blue emission layer. However, the present invention is not limited to this application, but may be applied to organic EL devices having three or more emission layers, assuring improved color purity by using similar methods. For example, the invention is applicable to an organic EL device having three emission layers capable of emitting red (R) light, green (G) and blue (B) light, respectively.

While the orange emission layer and the blue emission layer cooperate with each other to produce a white emission in the illustrated embodiments, the present invention is not limited to this arrangement, but may be applied to organic EL devices using a plurality of emission layers for emitting light having color other than white.

While the light-emitting position of each emission layer is assumed to be the upper surface of the emission layer in the illustrated embodiments, the present invention is not limited to this, but the light-emitting position of each emission layer may be assumed to be another position of the emission layer.

While the illustrated embodiments are concerned with organic EL devices as one type of light-emitting devices, the present invention is not limited to this application, but may be equally applied to other types of light-emitting devices.

While the orange emission layer and the blue emission layer are formed to be adjacent to each other in the illustrated embodiments, the present invention is not limited to this arrangement. For example, a layer other than an emission layer may be formed between the orange emission layer and the blue emission layer.

While the present invention is applied to bottom-emission-type organic EL devices that emit light from the rear surface (or the lower surface) of the glass substrate in the illustrated embodiments, the present invention is not limited to this arrangement. The invention may be equally applied to top-emission-type organic EL devices that emit light from the upper side (or top face) thereof, or organic EL devices that emit light from both of the upper and lower sides (or tope and bottom faces) thereof.

What is claimed is:

1. A light-emitting device comprising:

a first emission layer formed apart from a light-emitting surface with a plurality of layers interposed therebetween, and having a first maximum wavelength region $\lambda_X$; and a second emission layer formed on said first emission layer to provide a laminated structure, the second emission layer having a second maximum wavelength region $\lambda_Y$ that is different from said first maximum wavelength region $\lambda_X$, wherein a first optical film thickness range $L_1$ from a light-emitting position of said first emission layer to said light-emitting surface of the device, a second optical film thickness range $L_2$ from a light-emitting position of said second emission layer to said light-emitting surface, and respective film thicknesses of said plurality of layers, said first emission layer and said second emission layer are set, so as to increase the luminous intensity of color of an emission produced by mixing an emission from said first emission layer with an emission from said second emission layer.

2. The light-emitting device according to claim 1, wherein the optical film thickness range $L_1$ from the light-emitting position of said first emission layer to said light-emitting surface of the device, the optical film thickness range $L_2$ from the light-emitting position of said second emission layer to said light-emitting surface, and the film thicknesses of said plurality of layers, said first emission layer and said second emission layer are set according to expressions as follows:

$$L_1 = \lambda_X/4 \times m_1 = n_{11}d_1 + n_{21}d_2 + \ldots + n_{k1}d_k$$

$$L_2 = \lambda_Y/4 \times m_2 = n_{12}d_1 + n_{22}d_2 + \ldots + n_{k2}d_k$$

$m_1$, $m_2$: positive integer equal to or larger than 1 (on conditions that decimal fractions of $m_1$ and $m_2$ are equal to or smaller than 0.2 or equal to or larger than 0.8)

$d_1, d_2, \ldots d_k$: film thickness of each layer $n_{11}, n_{21}, \ldots n_{k1}$: index of refraction of each layer at $\lambda_X$ $n_{12}, n_{22}, \ldots n_{k2}$: index of refraction of each layer at $\lambda_Y$.

3. The light-emitting device according to claim 2, wherein the light-emitting position of said first emission layer is assumed to be one of the opposite surfaces of said first emission layer which is remote from said light-emitting surface of the device, and the light-emitting position of said second emission layer is assumed to be one of the opposite surfaces of said second emission layer which is remote from said light-emitting surface of the device.

4. The light-emitting device according to claim 1, wherein said plurality of layers comprise a substrate, a transparent anode, a hole injecting layer and a hole transport layer.

5. The light-emitting device according to claim 1, wherein:

the first maximum wavelength region $\lambda_X$ of said first emission layer comprises a maximum wavelength region $\lambda_1$ of red color;

the second maximum wavelength region $\lambda_Y$ of said second emission layer comprises a maximum wavelength region $\lambda_2$ of blue color and a maximum wavelength region $\lambda_3$ of green color; and said first optical film thickness range $L_1$, said second optical film thickness range $L_2$ and the film thicknesses of said plurality of layers, said first emission layer and said second emission layer are set so as to increase the luminous intensity in the respective maximum wavelength regions of said red color, said green color and said blue color.

6. The light-emitting device according to claim 5, wherein:

said first emission layer comprises an orange emission layer;

said second emission layer comprises a blue emission layer; and said first emission layer and the second emission layer cooperate with each other to produce a white emission.

7. A light-emitting device comprising:

a first emission layer formed apart from a light-emitting surface with a plurality of layers interposed therebetween, and having a first maximum wavelength region $\lambda_X$; and a second emission layer formed on said first emission layer to provide a laminated structure, the second emission layer having a second maximum wavelength region $\lambda_Y$ that is different from said first maximum wavelength region $\lambda_X$, wherein a first optical film thickness range $L_1$ from a light-emitting position of said first emission layer to said light-emitting surface of the device, a second optical film thickness range $L_2$ from a light-emitting position of said second emission layer to said light-emitting surface, and respective film thicknesses of said plurality of layers, said first emission layer and said second emission layer are set according to expressions as follows, so as to increase the luminous intensity of color of an emission produced by mixing an emission from said first emission layer with an emission from said second emission layer:

$$L_1 = \lambda_X/4 \times m_1 = n_{11}d_1 + n_{21}d_2 + \ldots + n_{k1}d_k$$

$$L_2 = \lambda_Y/4 \times m_2 = n_{12}d_1 + n_{22}d_2 + \ldots + n_{k2}d_k$$

$m_1$, $m_2$: positive integer equal to or larger than 1 (on conditions that decimal fractions of $m_1$ and $m_2$ are equal to or smaller than 0.2 or equal to or larger than 0.8)

$d_1, d_2, \ldots d_k$: film thickness of each layer $n_{11}, n_{21}, \ldots n_{k1}$: index of refraction of each layer at $\lambda_X$ $n_{12}, n_{22}, \ldots n_{k2}$: index of refraction of each layer at $\lambda_Y$.

8. A light-emitting device comprising:

a first emission layer formed apart from a light-emitting surface with a plurality of layers interposed therebetween, and having a first maximum wavelength region $\lambda_X$; and a second emission layer formed on said first emission layer to provide a laminated structure, the second emission layer having a second maximum wavelength region $\lambda_Y$ that is different from said first maximum wavelength region $\lambda_X$, wherein a first optical film thickness range $L_1$ from a light-emitting position of said first emission layer to said light-emitting surface of the device, a second optical film thickness range $L_2$ from a light-emitting position of said second emission layer to said light-emitting surface, and respective film thicknesses of said plurality of layers, said first emission layer and said second emission layer are set, so as to increase the luminous intensity in the first maximum wavelength region $\lambda_X$ of an emission spectrum provided by said first emission layer, and increase the luminous intensity in the second maximum wavelength region $\lambda_Y$ of an emission spectrum provided by said second emission layer.

9. The light-emitting device according to claim 8, wherein the optical film thickness range $L_1$ from the light-emitting position of said first emission layer to said light-emitting surface of the device, the optical film thickness range $L_2$ from the light-emitting position of said second emission layer to said light-emitting surface, and the film thicknesses of said plurality of layers, said first emission layer and said second emission layer are set according to expressions as follows:

$$L_1 = \lambda_X/4 \times m_1 = n_{11}d_1 + n_{21}d_2 + \ldots + n_{k1}d_k$$

$$L_2 = \lambda_Y/4 \times m_2 = n_{12}d_1 + n_{22}d_2 + \ldots + n_{k2}d_k$$

$m_1$, $m_2$: positive integer equal to or larger than 1 (on conditions that decimal fractions of $m_1$ and $m_2$ are equal to or smaller than 0.2 or equal to or larger than 0.8)

$d_1, d_2, \ldots d_k$: film thickness of each layer $n_{11}, n_{21}, \ldots n_{k1}$: index of refraction of each layer at $\lambda_X$ $n_{12}, n_{22}, \ldots n_{k2}$: index of refraction of each layer at $\lambda_Y$.

10. The light-emitting device according to claim 9, wherein the light-emitting position of said first emission layer is assumed to be one of the opposite surfaces of said first emission layer which is remote from said light-emitting surface of the device, and the light-emitting position of said second emission layer is assumed to be one of the opposite surfaces of said second emission layer which is remote from said light-emitting surface of the device.

11. The light-emitting device according to claim 8, wherein said plurality of layers comprise a substrate, a transparent anode, a hole injecting layer and a hole transport layer.

12. The light-emitting device according to claim 8, wherein:

the first maximum wavelength region $\lambda_X$ of said first emission layer comprises a maximum wavelength region $\lambda_1$ of red color;

the second maximum wavelength region $\lambda_Y$ of said second emission layer comprises a maximum wavelength region $\lambda_2$ of blue color and a maximum wavelength region $\lambda_3$ of green color; and said first optical film thickness range $L_1$, said second optical film thickness range $L_2$ and the film thicknesses of said plurality of layers, said first emission layer and said second emission layer are set so as to increase the luminous intensity in the maximum wavelength regions of said red color and said blue color.

13. The light-emitting device according to claim 12, wherein:

said first emission layer comprises an orange emission layer;

said second emission layer comprises a blue emission layer; and said first emission layer and said second emission layer cooperate with each other to produce a white emission.

14. A light-emitting device comprising:

a first emission layer formed apart from a light-emitting surface with a plurality of layers interposed therebetween, and having a first maximum wavelength region $\lambda_X$; and a second emission layer formed on said first emission layer to provide a laminated structure, the second emission layer having a second maximum wavelength region $\lambda_Y$ that is different from said first maximum wavelength region $\lambda_X$, wherein a first optical film thickness range $L_1$ from a light-emitting position of said first emission layer to said light-emitting surface of the device, a second optical film thickness range $L_2$ from a light-emitting position of said second emission layer to said light-emitting surface, and respective film thicknesses of said plurality of layers, said first emission layer and said second emission layer are set according to expressions as follows, so as to increase the luminous intensity in the first maximum wavelength region $\lambda_X$ of an emission spectrum provided by said first emission layer, and increase the luminous intensity in the second maximum wavelength region $\lambda_Y$ of an emission spectrum provided by said second emission layer:

$$L_1 = \lambda_X/4 \times m_1 = n_{11}d_1 + n_{21}d_2 + \ldots + n_{k1}d_k$$

$$L_2 = \lambda_Y/4 \times m_2 = n_{12}d_1 + n_{22}d_2 + \ldots + n_{k2}d_k$$

$m_1, m_2$: positive integer equal to or larger than 1 (on conditions that decimal fractions of $m_1$ and $m_2$ are equal to or smaller than 0.2 or equal to or larger than 0.8)

$d_1, d_2, \ldots d_k$: film thickness of each layer $n_{11}, n_{21}, \ldots n_{k1}$: index of refraction of each layer at $\lambda_X$ $n_{12}, n_{22}, \ldots n_{k2}$: index of refraction of each layer at $\lambda_Y$.

* * * * *